(12) United States Patent
Lee et al.

(10) Patent No.: US 10,798,844 B2
(45) Date of Patent: Oct. 6, 2020

(54) RAIL ASSEMBLY HAVING A PIVOTING JOINT

(71) Applicant: Lenovo Enterprise Solutions (Singapore) Pte. Ltd., Singapore (SG)

(72) Inventors: Chang-Hsing Lee, New Taipei (TW); ZhenDe Fu, Shanghai (CN); Wan-Ya Lin, Taipei (TW); Jui-Yun Chang, Taichung (TW)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 16/104,173

(22) Filed: Aug. 17, 2018

(65) Prior Publication Data

US 2019/0059170 A1    Feb. 21, 2019

(30) Foreign Application Priority Data

Aug. 18, 2017   (CN) .......................... 2017 1 0712048

(51) Int. Cl.
*H05K 7/14*    (2006.01)
*H05K 5/02*    (2006.01)

(52) U.S. Cl.
CPC ......... *H05K 7/1489* (2013.01); *H05K 5/0221* (2013.01); *H05K 7/1494* (2013.01)

(58) Field of Classification Search
CPC .. H05K 7/1489; H05K 5/0221; H05K 7/1494; H05K 7/16; H05K 7/1488; H05K 7/183; H05K 7/186; A47B 88/48; B60R 2011/0085; F16M 2200/024; F16M 11/10

USPC .......... 248/424, 244, 286.1, 298.1; 211/104, 211/151; 108/143; 312/322–323
See application file for complete search history.

(56) References Cited

U.S. PATENT DOCUMENTS

| | | | | |
|---|---|---|---|---|
| 1,867,907 A * | 7/1932 | Dawson | .................. | A47B 63/02 312/323 |
| 2,519,632 A * | 8/1950 | Brinker | .................... | B42F 17/18 312/323 |
| 2,655,422 A * | 10/1953 | Gussack | ................. | A47B 88/48 312/333 |
| 2,856,450 A * | 10/1958 | Padgett | ..................... | H05K 7/16 174/559 |
| 3,133,768 A * | 5/1964 | Klakovich | .............. | A47B 88/49 384/17 |
| 3,146,048 A * | 8/1964 | Graham | ................... | H05K 7/16 312/323 |

(Continued)

*Primary Examiner* — Christopher Garft
(74) *Attorney, Agent, or Firm* — Jeffrey Streets

(57) ABSTRACT

An apparatus provides an extendable rail assembly including a track for securing to a rack, a first rail slidably coupled to the track, and a second rail slidably coupled to the first rail. The first rail is movable relative to the track between retracted and extended positions, wherein the first rail includes first and second rail sections coupled together by a pivot joint. The second rail is movable relative to the first rail between retracted and extended positions. Furthermore, with the first rail in the extended position and the second rail in the extended position, the pivot joint allows the second rail and the second rail section of the first rail to pivot relative to the track and the first rail section of the first rail. A pair of rail assemblies may be secured to a rack to support a member, such as a server.

20 Claims, 10 Drawing Sheets

(56) References Cited

U.S. PATENT DOCUMENTS

| | | | | |
|---|---|---|---|---|
| 3,356,432 | A * | 12/1967 | Mariotte | A47B 88/48 |
| | | | | 312/323 |
| 4,258,967 | A * | 3/1981 | Boudreau | A47B 88/48 |
| | | | | 312/273 |
| 4,445,616 | A * | 5/1984 | Mancusi | B65D 19/44 |
| | | | | 108/55.1 |
| 5,169,221 | A * | 12/1992 | Wheeler | H05K 7/16 |
| | | | | 16/358 |
| 5,823,487 | A * | 10/1998 | Kirchhoff | A47B 21/0314 |
| | | | | 248/118 |
| 6,185,092 | B1 * | 2/2001 | Landrum | G06F 1/16 |
| | | | | 312/223.1 |
| 6,938,866 | B2 * | 9/2005 | Kirchhoff | A47B 21/0314 |
| | | | | 248/274.1 |
| 7,113,393 | B2 * | 9/2006 | Kirchhoff | A47B 21/0314 |
| | | | | 361/679.2 |
| 2003/0042380 | A1 * | 3/2003 | Hagglund | A47B 21/0314 |
| | | | | 248/286.1 |
| 2017/0071072 | A1 * | 3/2017 | Adams | H05K 7/183 |
| 2017/0156494 | A1 * | 6/2017 | Cochran | A47B 46/005 |
| 2017/0164506 | A1 * | 6/2017 | Anderson | H05K 7/1488 |
| 2019/0082835 | A1 * | 3/2019 | Chen | H05K 7/1489 |

\* cited by examiner

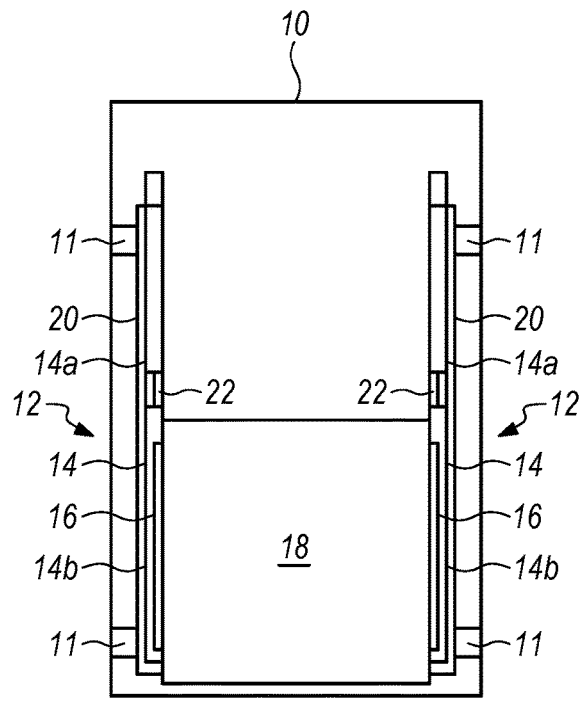
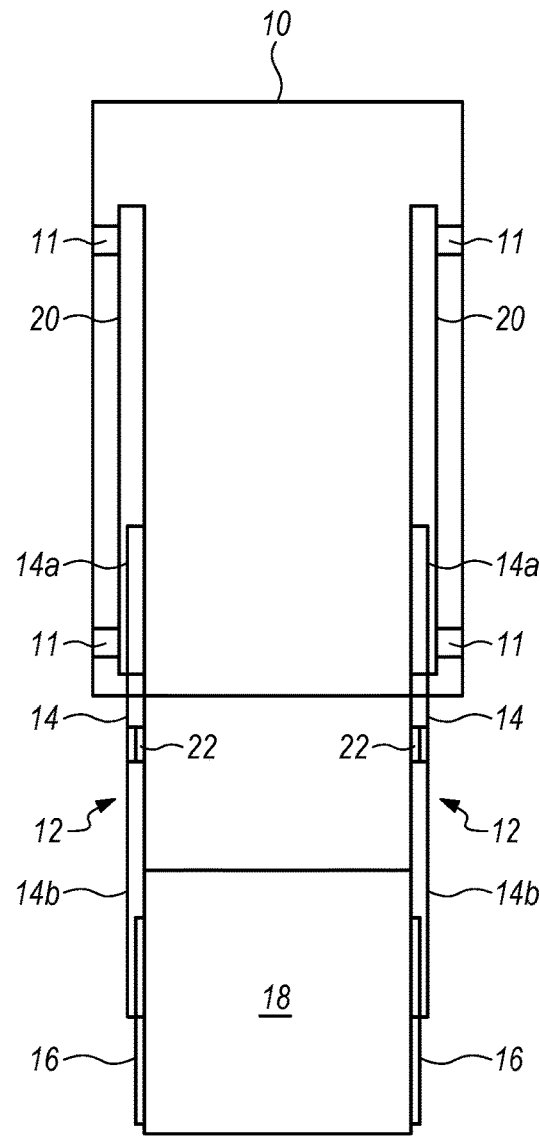
FIG. 3A
FIG. 3B

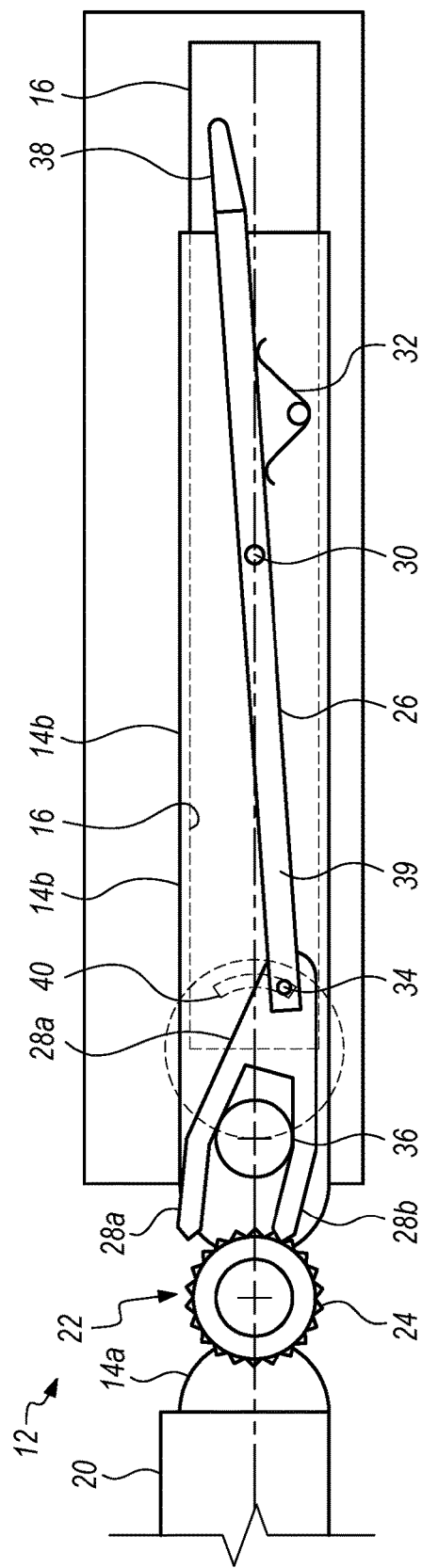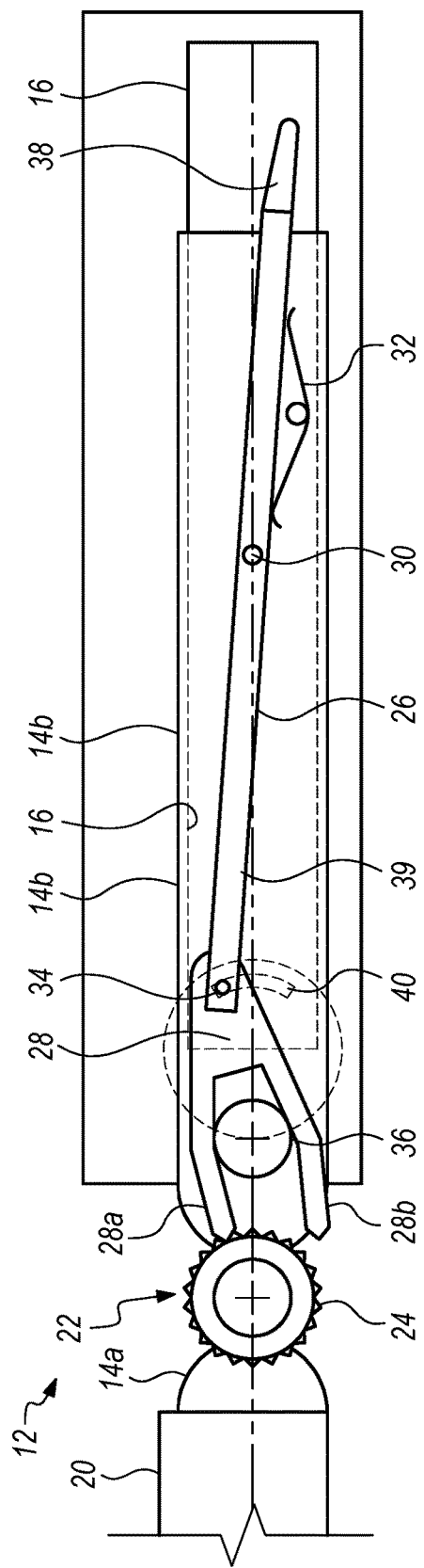

RAIL ASSEMBLY HAVING A PIVOTING JOINT

CROSS-REFERENCE TO RELATED APPLICATIONS

This application claims priority under 35 U.S.C. § 119 to Chinese Patent Application No. 201710712048.9 filed Aug. 18, 2017, the entire text of which is specifically incorporated by reference herein.

BACKGROUND

The present disclosure relates to a rail assembly and, in particular, such an assembly suitable for, but not limited to, use in a server rack.

BACKGROUND OF THE RELATED ART

A service team is responsible with performing maintenance of servers housed in a standard server rack, which has a height of 42U (i.e. up to 2 meters). A rack unit (abbreviated as "U") is a unit of measurement defined as 1.75 inches (44.45 mm), which is most frequently used as a measurement of the height of 19-inch and 23-inch rack frames, as well as the height of the frame or individual units of equipment mounted in these frames, whereby the height of the frame or equipment is expressed as multiples of rack units. For example, a typical full-sized rack cage is 42U high, while equipment is typically 1U, 2U, 3U or 4U high.

FIG. 1A illustrates that a typical user is comfortable using a service laptop on a sliding shelf at a rack height of about 21U. FIG. 1B illustrates that it is relatively easy for a typical person to access and perform maintenance tasks on a server that is located up to the 25U position. However, it is relatively difficult to perform maintenance tasks on servers located at greater heights, such as heights of 28U or above. A service team member may need to use a ladder in order to access and service servers that are located in rack positions above about 28U. This adds to inconvenience and danger to the members of the service team.

BRIEF SUMMARY

One embodiment provides an apparatus, such as a sliding rail assembly. The apparatus comprises a track for securing to a rack, a first rail slidably coupled to the track, and a second rail slidably coupled to the first rail. The first rail is movable relative to the track between a retracted position and an extended position, wherein the first rail includes a first rail section, a second rail section, and a pivoting joint coupling the first rail section to the second rail section. The second rail is movable relative to the first rail between a retracted position and an extended position. Furthermore, with the first rail in the extended position and the second rail in the extended position, the pivoting joint allows the second rail and the second rail section of the first rail to pivot relative to the track and the first rail section of the first rail.

Another embodiment provides an apparatus, such as a rack for supporting and servicing electronic equipment. The apparatus comprises a rack having a frame for supporting a server, and a pair of rail assemblies for coupling opposing sides of the server to the frame. Each rail assembly includes a track secured to the frame, a first rail slidably coupled to the track, and a second rail for securing to one of the opposing sides of the server. The first rail is movable relative to the track between a retracted position and an extended position, wherein the first rail includes a first rail section, a second rail section, and a pivoting joint coupling the first rail section to the second rail section. The second rail is slidably coupled to the first rail and movable relative to the first rail between a retracted position and an extended position. Furthermore, with the first rail in the extended position and the second rail in the extended position, the pivoting joint allows the second rail and the second rail section of the first rail to pivot relative to the track and the first rail section of the first rail.

BRIEF DESCRIPTION OF THE SEVERAL VIEWS OF THE DRAWINGS

FIGS. 3A and 3B are top views of the rail assembly of FIG. 2 in a fully retracted position and a fully extended position, respectively.

FIGS. 5A and 5B are schematic partial side views of the rail assembly, illustrating the articulating rail member with a locked condition and an unlocked condition, respectively.

DETAILED DESCRIPTION

Figure 1A:
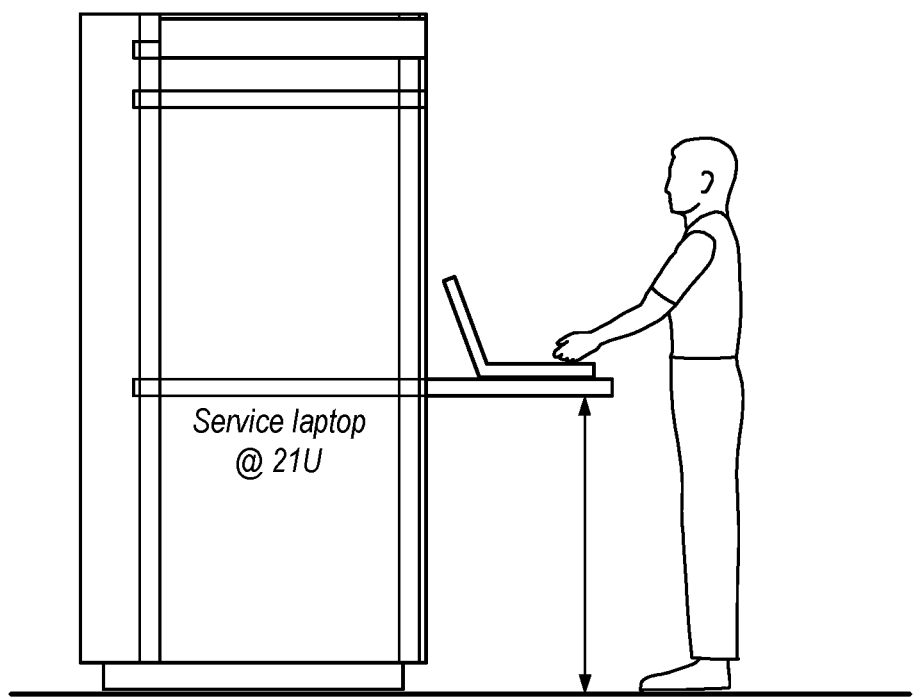
FIGS. 1A and 1B are diagrams illustrating the servicing of servers located at different heights in a server rack.
Figure 1B:
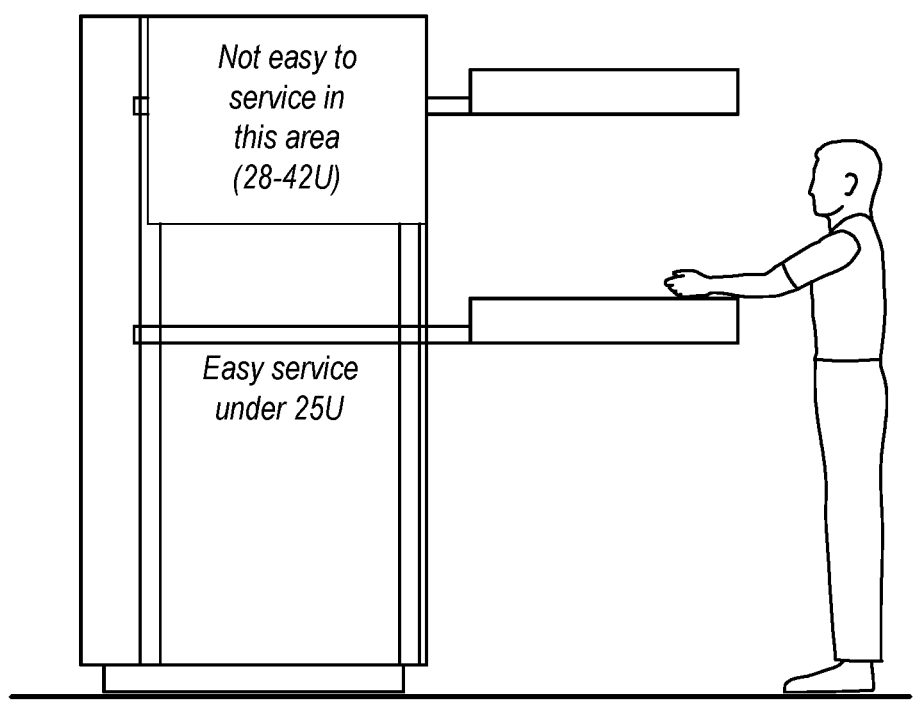

One embodiment provides an apparatus, such as a sliding rail assembly. The apparatus comprises a track for securing to a rack, a first rail slidably coupled to the track, and a second rail slidably coupled to the first rail. The first rail is movable relative to the track between a retracted position and an extended position, wherein the first rail includes a first rail section, a second rail section, and a pivoting joint coupling the first rail section to the second rail section. The second rail is movable relative to the first rail between a retracted position and an extended position. Furthermore, with the first rail in the extended position and the second rail in the extended position, the pivoting joint allows the second rail and the second rail section of the first rail to pivot relative to the track and the first rail section of the first rail.

In various embodiments, the pivoting joint allows the second rail and the second rail section of the first rail to pivot downwardly to an acute angle greater than 45 degrees or to a substantially vertical orientation. An optional leg may be pivotably coupled to the second rail, such that the leg may pivot between a retracted position along the second rail and a deployed position to engage the rack and support the second rail at an acute angle relative to the rack.

Embodiments of the apparatus preferably further comprise a lock manually movable between a locked position and an unlocked position. The locked position limits or prevents downward pivotal movement of the second rail and the second rail section of the first rail about the pivoting joint relative to the track. The unlocked position allows downward pivotal movement of the second rail and the second rail section of the first rail about the pivoting joint relative to the track. In use, a person would pull the server or other component to an extended position beyond the front of the rack, then unlock the lock and lower the server or other component to an angle or height at which the person can service the server or other component. At the desired angle or height, the person would put the lock in the locked position to limit any further downward pivotal movement of the server or other component.

In one option, the lock includes a ratchet mechanism. In the unlocked position, the ratchet mechanism may be used to allow downward pivotal movement of the second rail and the second rail section of the first rail about the pivoting joint. In the locked position, the ratchet mechanism may be used to limit further downward pivotal movement of the second rail and the second rail section of the first rail about the pivoting joint. In a preferred implementation, the ratcheting mechanism may include a gear fixed to the first rail section of the first rail and a pawl coupled to the second rail section of the first rail. Furthermore, the lock may include a lever arm pivotally coupled to the second rail section of the first rail and extending beyond a distal end of the second rail section of the first rail, wherein manually actuating the lever arm moves the lock from the locked position to the unlocked position. Still further, the apparatus may include a spring that biases the lever arm to a position that puts the lock in the locked position, wherein manually actuating the lever arm to move the lock to the unlocked position requires overcoming a spring force of the spring. Releasing the lever arm enables the spring to automatically move the lock to the locked position.

In one embodiment of the lock, the pawl may be pivotally coupled to the second rail section and pivotally coupled to a distal end of the lever arm. With the lock in the locked position, the pawl engages the gear to prevent downward pivotal movement of the second rail and the second rail section of the first rail about the pivoting joint. In response to manually actuating the lever arm to move the lock to the unlocked position, the pawl disengages the gear to allow downward pivotal movement of the second rail and the second rail section of the first rail about the pivoting joint.

In another embodiment, the lock includes a catch member having a first finger that forms the pawl and a second finger that forms a second pawl, wherein the catch member is coupled to the a distal end of the lever arm. With the lock in the locked position, the first finger engages the gear to prevent downward pivotal movement of the second rail and the second rail section of the first rail about the pivoting joint. However, in the locked position, the second finger may be disengaged from the gear and the first finger may permit upward pivotal movement. In response to manually actuating the lever arm to move the lock to the unlocked position, the second finger engages the gear and allows downward pivotal movement of the second rail and the second rail section of the first rail about the pivoting joint. However, in the unlocked position, the first finger may be disengaged from the gear and the second finger may permit downward pivotal movement.

Another embodiment provides an apparatus, such as a rack for supporting and servicing electronic equipment. The apparatus comprises a rack having a frame for supporting a server, and a pair of rail assemblies for coupling opposing sides of the server to the frame. Each rail assembly includes a track secured to the frame, a first rail slidably coupled to the track, and a second rail for securing to one of the opposing sides of the server. The first rail is movable relative to the track between a retracted position and an extended position, wherein the first rail includes a first rail section, a second rail section, and a pivoting joint coupling the first rail section to the second rail section. The second rail is slidably coupled to the first rail and movable relative to the first rail between a retracted position and an extended position. Furthermore, with the first rail in the extended position and the second rail in the extended position, the pivoting joint allows the second rail and the second rail section of the first rail to pivot relative to the track and the first rail section of the first rail.

The apparatus preferably further includes a support member, such as a server enclosure, secured between the second rail of each rail assembly. Accordingly, the pair of rail assemblies are preferably used together to support a single support member or server and to facilitate servicing of the server or other components. Optionally, the region of the rack that supports a server or other member may be referred to as a bay.

The rail assemblies that are secured in the rack may have any one or more of the features of the rail assemblies described herein. Accordingly, the description of the rail assemblies will not be repeated here in the context of a rack. However, a pair of rail assemblies are preferably used to secure a server enclosure, other component enclosure or other support member within the rack. Therefore, a rack that will support a plurality of servers or other members may include an equal number of pairs of rail assemblies. Optionally, the rack may include the pairs of rail assemblies only for servers or other members that are above a certain height, such as above 25U.

Figure 2:
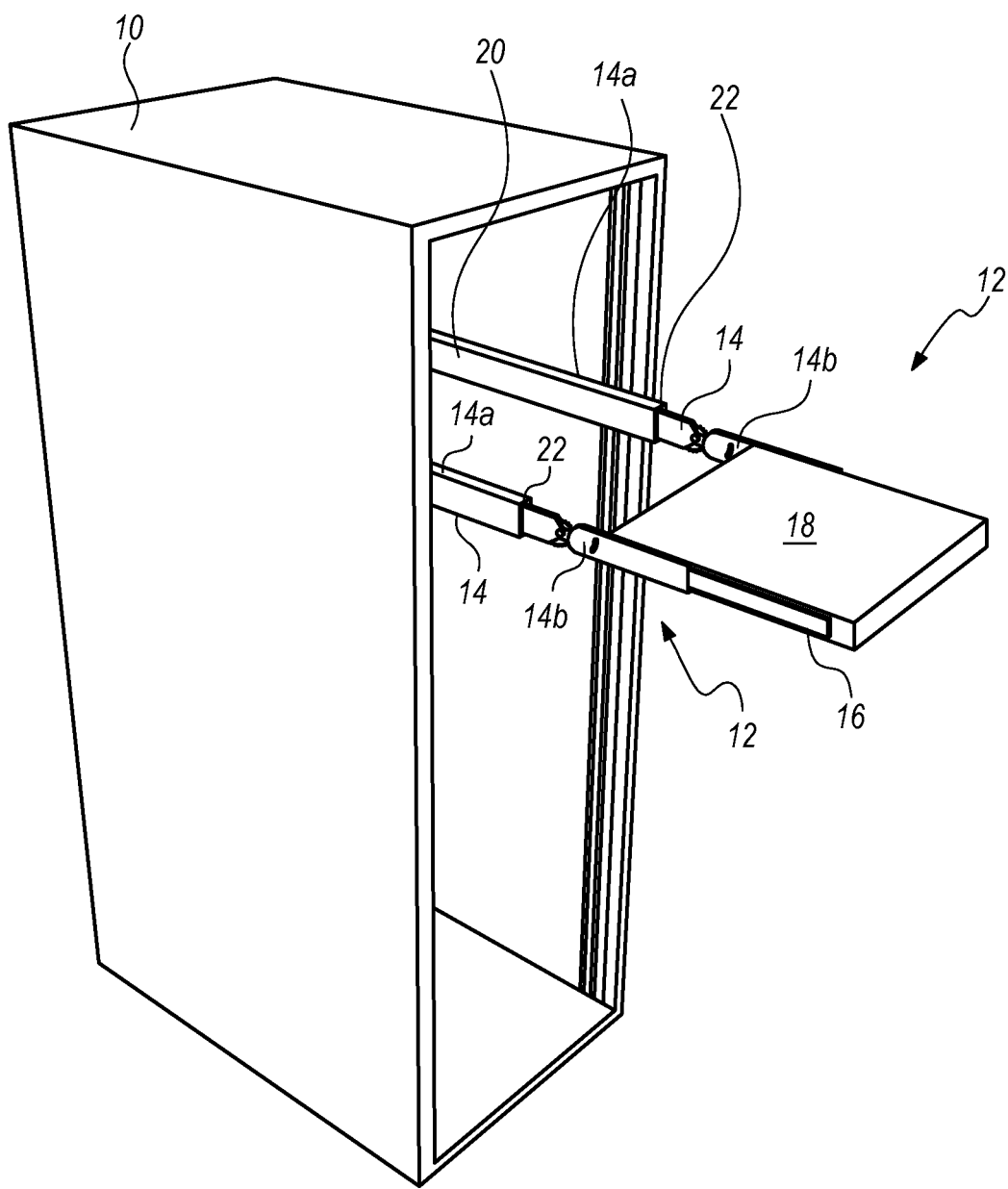
FIG. 2 is a perspective view of a server rack with a pair of rail assemblies according to an embodiment of the present invention.

FIG. 2 is a perspective view of a rack 10 with a pair of rail assemblies 12 according to an embodiment of the present invention. As shown, a support member 18 is secured between opposing rail assemblies 12. Each rail assembly 12 has a track 20 secured to the rack 10, a first rail 14 slidably coupled to the track 20, and a second rail 16 slidably coupled to the first rail 14. The first rail 14 is movable relative to the track 20 between a retracted position (see also FIG. 3A) and an extended position (see also FIG. 3B), wherein the first rail 14 includes a first rail section 14a, a second rail section 14b, and a pivoting joint 22 coupling the first rail section 14a to the second rail section 14b. The second rail 16 is movable relative to the first rail 14 between a retracted position and an extended position. Furthermore, with the first rail 14 in the extended position and the second rail 16 in the extended position (as shown), the pivoting joint 22 allows the second rail 16 and the second rail section 14b of the first rail, as well as the support member 18, to pivot relative to the track 20 and the first rail section 14a of the first rail. In fact, each member 14b, 16, 18 extended beyond the pivoting joint 22 may be pivoted downward relative to the rack 10 to facilitate easy user access for servicing a support member, such as a server or other component. The second rail 16 is preferably prevented from being accidentally pulled out of the first rail 14 when the second rail 16 is in either a horizontal orientation or a downwardly angled orientation. Optionally, the first rail 14 may be prevented from being accidentally pulled out of the track 20.

FIGS. 3A and 3B are top views of the rail assembly of FIG. 2 in a fully retracted position and a fully extended position, respectively. In both of FIGS. 3A and 3B, each the rail assembly 12 includes a linear track 20 secured to frame members 11 of the rack 10. The first rail 14 is parallel to and slidably movable along the track 20. Furthermore, the second rail 16 is parallel to and slidably movable relative to the first rail 14. Because the second rails 16 of a pair of opposing rail assemblies 12 support the member 18, the second rails 16 move simultaneously with each other as the member 18 (which may be a component or a plate or tray for supporting a component) is manually extended from the rack or retracted into the rack. Furthermore, the movement of a second rail 16 may cause extension or retraction of the first rail 14 connected thereto in order to facilitate a fully extended position, where the extension of the rails is preferably limited to prevent accidental disengagement between either the track 20 and the first rail 14 or accidental disengagement between the first rail 14 and the second rail 16.

FIG. 3A illustrates a fully retracted position of the pair of rail assemblies 12 and the component 18. The component 18 is preferably able to be stored within the boundaries of the rack 10 while being supported on opposing sides by the pair of rail assemblies 12. In this embodiment, the second rail 16 may slide along or within the second rail section 14b of the first rail 14. Furthermore, the first rail 14, including both the first rail section 14a and the second rail section 14b, may slide along or within the track 20.

FIG. 3B illustrates a fully extended position of the pair of rail assemblies 12 and the component 18. Each track 20 remains in a fixed position on opposing sides of the rack 10, such as being secured to lateral inner surfaces of the rack 10 or the frame members 11 of the rack 10. Each track 20 is slidably engaged directly with a first rail 14 and indirectly with a second rail 16, such that the first rail 14 and the second rail 16 are slidably movable along and relative to one another and the track 20. Furthermore, each rail assembly 12 may be considered to be slidably movable relative to the server rack 10.

In the fully extended position of FIGS. 2 and 3B, the two second rails 16, the component 18, and the pivoting joint 22 are extended to a point that they are completely clear of the internal volume of the server rack 10. In this position, the pivoting joint 22 may be operated to pivot the component 18 downward for servicing.

Figure 4A:
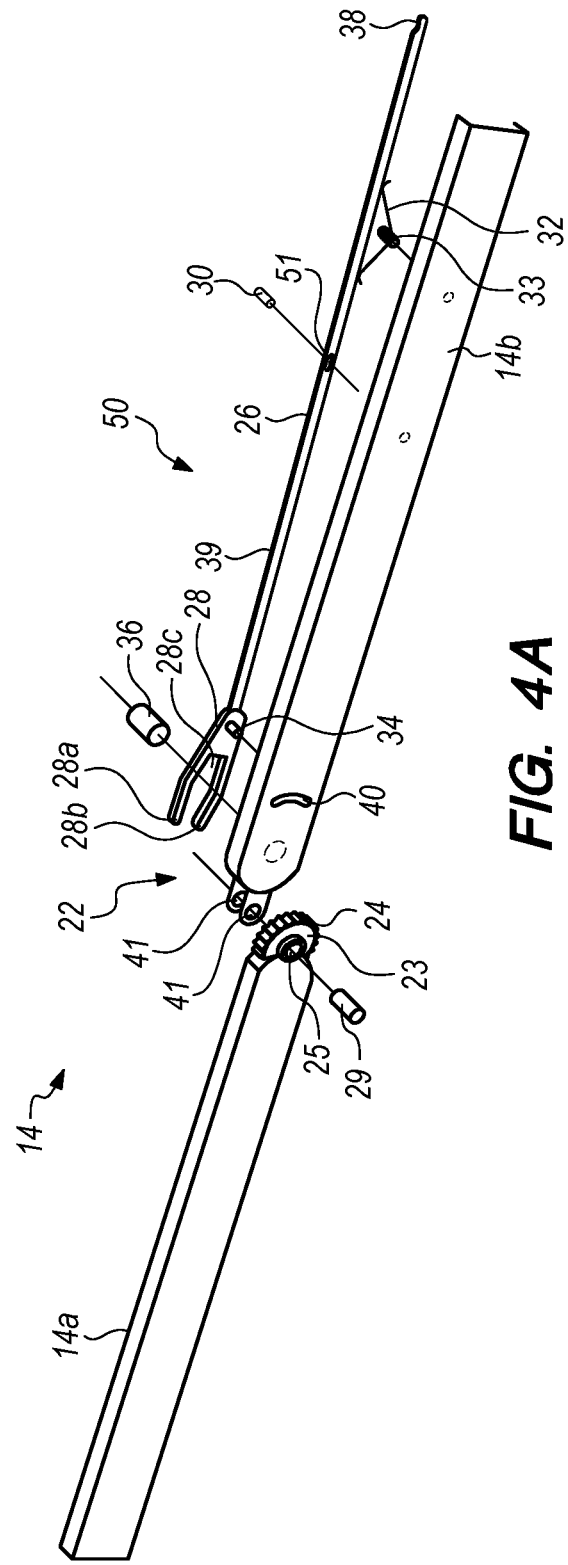
FIGS. 4A, 4B and 4C provide a perspective assembly view, a top assembly view, and a partial perspective view of an articulating rail member for use in the rail assembly.
Figure 4B:
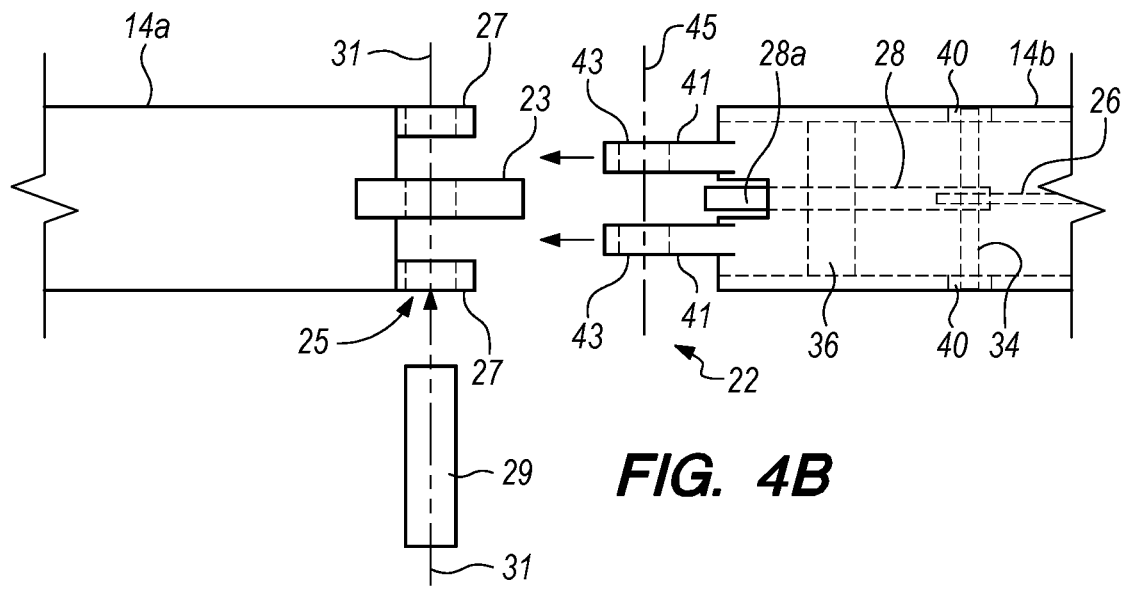
Figure 4C:
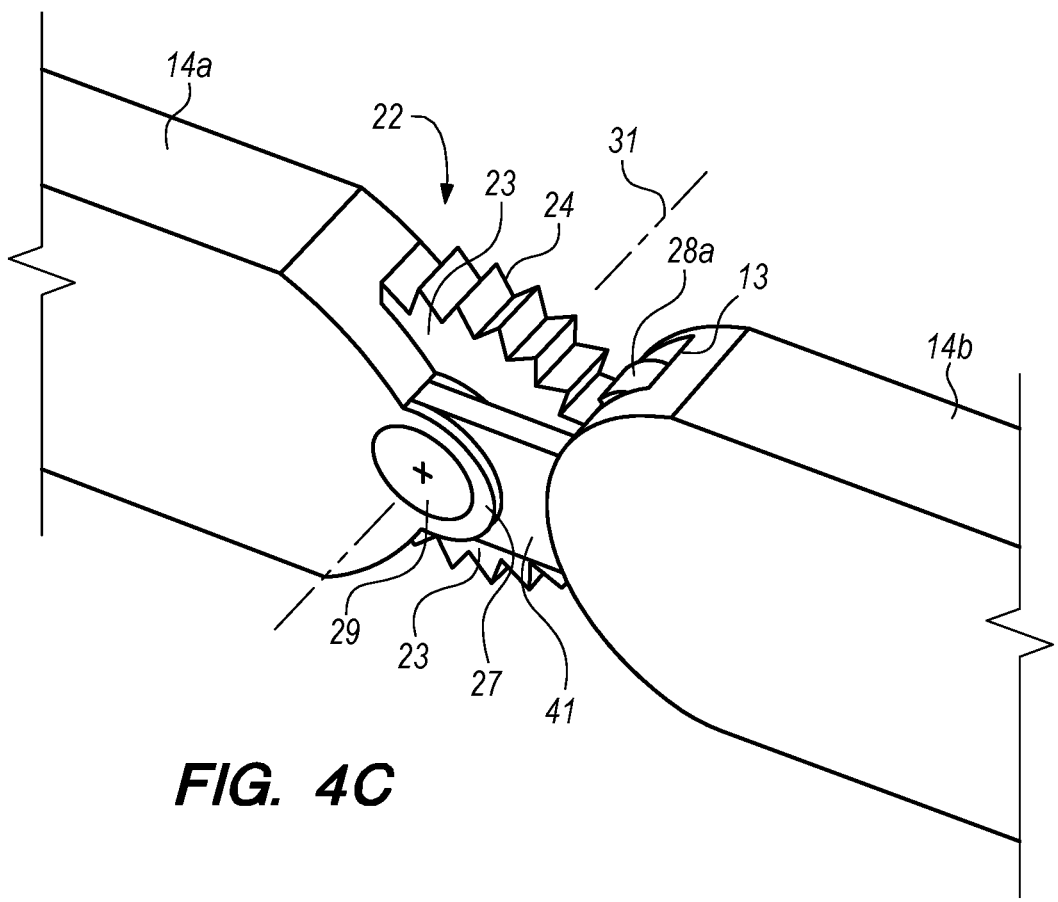

FIGS. 4A, 4B and 4C provide a perspective assembly view, a top assembly view, and a partial perspective view of a first rail 14 for use in the rail assembly 12 of FIGS. 2, 3A, and 3B. The first rail 14 includes a pivot joint 22 that allows a second rail section 14b to pivot or articulate relative to the first rail section 14a. FIGS. 4A and 4B illustrate the structure and relationships of various components of the first rail 14, whereas FIG. 4C illustrates a portion of the first rail 14 after assembly.

The first rail section 14a has an end with a fixed gear 23. In other words, the gear 23 forms the end of the first rail section 14a and is secured to the first rail section in a manner that prevents rotation there between. However, the gear 23 may include a hole 25 there through. As shown best in the top view of FIG. 4B, the end of the first rail section 14a may center the gear 23 between the sides of the first rail section 14a and may include a pair of support plates 27 that are separated from the gear 23 by a narrow gap. The hole 25 extends through the gear 23 as well as the pair of support plates 27 for receiving the hinge pin 29, which establishes an axis of rotation 31 for the pivot joint 22.

The second rail section 14b has an end with a pair of hinge plates 41. As shown best in FIG. 4B, each hinge plate 41 has a hole 43 with an axial centerline 45 that aligns with the axis or rotation 31 when the hinge plates 41 are inserted into the narrow gaps between the support plates 27 and the gear 23. With the hinge plates 41 of the second rail section 14b inserted into the narrow gaps of the first rail section 14a and with the holes 43 through hinge plates 41 aligned with the holes 25 through the support plates 27 and gear 23, the hinge pin 29 is inserted there through (i.e., through a support plate 27, a hinge plate 41, the gear 23, another hinge plate 41, and the other support plate 27) and secured in position. The assembled pivot joint 22 in the first rail 14 is shown in FIG. 4C.

In reference to FIG. 4A, the second rail section 14b further includes a lock 50. The lock 50 is secured to the second rail section 14b, but selectively engages the teeth 24 of the gear 23 (as shown in FIGS. 5A and 5B) that is part of the first rail section 14a. The illustrated embodiment of the lock 50 includes a catch member 28 having a first finger or pawl 28a, a second finger or pawl 28b, and an opening 28c that allows the catch member 28 to pivot about a pivot member 36. The pivot member is secured to a side of the second rail section 14b in a position that allows the fingers 28a, 28b to selectively engage the teeth 24 of the gear 23 when the rail assembly 14 is in use.

The catch member 28 is actuated between a locked position and an unlocked position by a lever arm 26. The lever arm 26 is pivotally connected to the second rail section 14b by a pivot pin 30, and the lever arm 26 is biased in a direction that will put the lock 50 in a locked position. Specifically, a free distal end 38 of the lever arm 26 may be biased upward (as shown in FIG. 4A) by a spring 32, which may be a leaf spring secured about a member 33 that is secured to the second rail section 14b. When the spring 32 moves the free end 38 of the lever arm 26 to an upward position, the lever arm 26 pivots about the pivot pin 30 such that an opposite end 39 of the lever arm 26 moves downward. The opposite end 39 of the lever arm 26 is itself pivotally coupled to a proximate end of the catch member 28 and moves a pin 34 that rides within a curved slot 40 in the side of the second rail section 14b. The arc-shaped slot 40 preferably forms an arc having a center of curvature that is the central longitudinal axis of the cylindrical member 36. The catch member 28 has an upper finger 28a and a lower finger 28b.

In one option, since the catch member rotates about the pivot member 36, the lever arm 26 may have an elongate slot for engaging the pin 34 or an elongate slot 51 for receiving the pin 30. Either elongate slot provides the lever arm 26 and catch member 28 with sufficient tolerance to avoid binding as they pivot about the pivot member 36 and the pivot pin 30. In reference to FIG. 4C, note that the second rail section 14b has a window 13 that allows one or more pawl, such as the first finger 28a or second finger 28b, to directly engage the teeth 24 of the gear 23. Specifically, a pawl 28a, 28b may selectively engage the teeth 24 according to the position of the lever arm 26 regardless of the angle between the first rail section 14a and the second rail section 14b.

FIGS. 5A and 5B are schematic partial side views of the rail assembly 12, illustrating the articulating rail member with a locked condition and an unlocked condition, respectively. In reference to FIG. 5A, the rail assembly 12 is illustrated in a locked condition. In the locked condition, the spring 32 pushes the free distal end 38 of the lever arm 26 upward, which pushes the opposite end 39 of the lever arm 26 downward. The downward movement of the end 39 causes the catch member 28 to pivot about the pivot member 36 to the position shown. Optionally, the catch member 28 may engage against a floor or lower edge of the second rail section 14b to limit further pivoting in the clockwise direction. Accordingly, the second finger 28b engages the teeth 24 of the gear 23 on the first rail section 14a. This locks the second rail section 14b, the second rail 16 and any server, component or other support member 18 from rotating downward. However, if these members are lifted, the second finger 28b may move over and past any number of teeth 24 as the members pivot about the pivot joint 22.

By way of such an arrangement, the gear 22, the arm 26 and the catch member 28 collectively form a ratcheting mechanism controlling the pivoting movement of the rail assembly 12. In particular, the ratcheting mechanism controls the relative pivotal movement between the first rail section 14a and the second rail section 14b, and thus also the pivotal movement of the second rail 16 relative to the stationary pair of tracks 20. Specifically, with the rail assembly 12 in the fully extended configuration (as shown in FIGS. 2 and 3B), and when the free end 38 of the arm 26 (which acts as a locking member) is in an upper position (as shown in FIG. 5A), a pin 34, which is secured to the catch member 28, is moved through an arc-shaped slot 40 to its lowermost position, to cause the catch member 28 to pivot about the cylindrical member 36 in the clockwise direction (as seen in FIG. 8), so as to bring the lower finger 28b of the catch member 28 into engagement with the teeth 24 of the gear 22. When the lower finger 28b of the catch member 28 comes into engagement with the teeth 24 of the gear 22, the second rail section 14b cannot pivot in the clockwise direction (i.e. downwardly) as seen in FIG. 5A relative to the first rail 14a and the pair of tracks 20. The second rail section 14b may thus said to be locked relative to the first rail section 14a and the pair of tracks 20.

However, even in the "locked" position, the second rail section 14b may still pivot in the counter-clockwise direction (i.e. upwardly) relative to the first rail 14a and the pair of tracks 20, because the lower finger 28b of the catch member 28 will slide up and over the teeth 24 as the pawl of a ratchet is known to do. Note if the second rail section 14b is lifted by a person, there is nothing to prevent the catch member 28 from rotating slightly counter-clockwise to allow pivoting between the rail sections 14a, 14b.

FIG. 5B is a diagram of the rail assembly 12 in an unlocked condition. For example, a person may manually move the free end 38 of the arm 26 to a lower position (as shown) to unlock the pivoting joint 22 of the rail assembly 12. With the free end 28 moved downward, the lever arm 26 moves the pin 34 on the catch member 28 through the arc-shaped slot 40 to its uppermost position and causes the catch member 28 to pivot about the cylindrical member 36 in the counter-clockwise direction (as shown in FIG. 5B) and bring the upper finger 28a of the catch member 28 into engagement with the teeth 24 of the gear 22.

Because of the shape of the teeth 24 of the gear 22 in combination with the configuration of the catch member 28, when the upper finger 28a of the catch member 28 comes into engagement with the teeth 24 of the gear 22, the second rail section 14b cannot pivot in the counter-clockwise direction (i.e. upwardly) relative to the first rail section 14a and the pair of tracks 20. However, in this position, the second rail section 14b may still pivot in the clockwise direction (i.e. downwardly) relative to the first rail 14a and the pair of tracks 20. The second rail section 14b is thus said to be unlocked relative to the first rail section 14a and the pair of tracks 20. When the second rail section 14b is thus unlocked, the second rail 16 and the support member 18 may pivot downwardly relative to the first rail section 14a and the pair of tracks 20, when the upper finger 28a moves out and over the teeth 24.

Figure 6A:
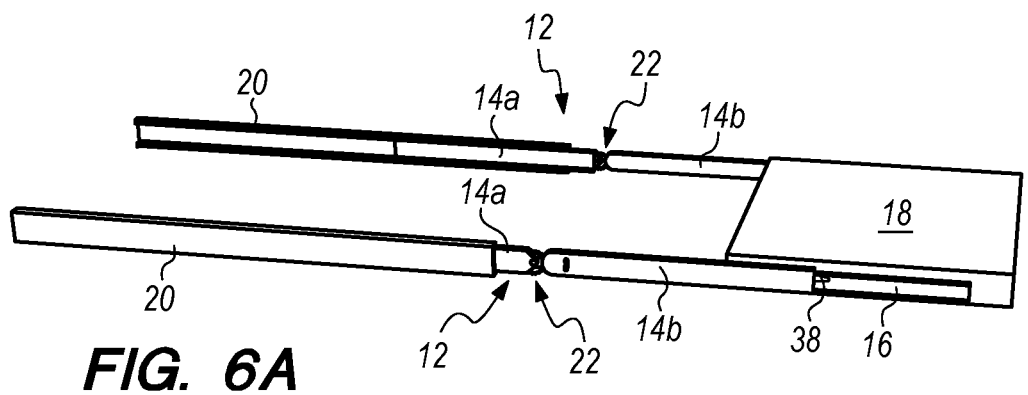
FIGS. 6A, 6B and 6C are perspective views of the rail assembly with the articulating rail member in straight, angled and downward positions, respectively.
Figure 6B:
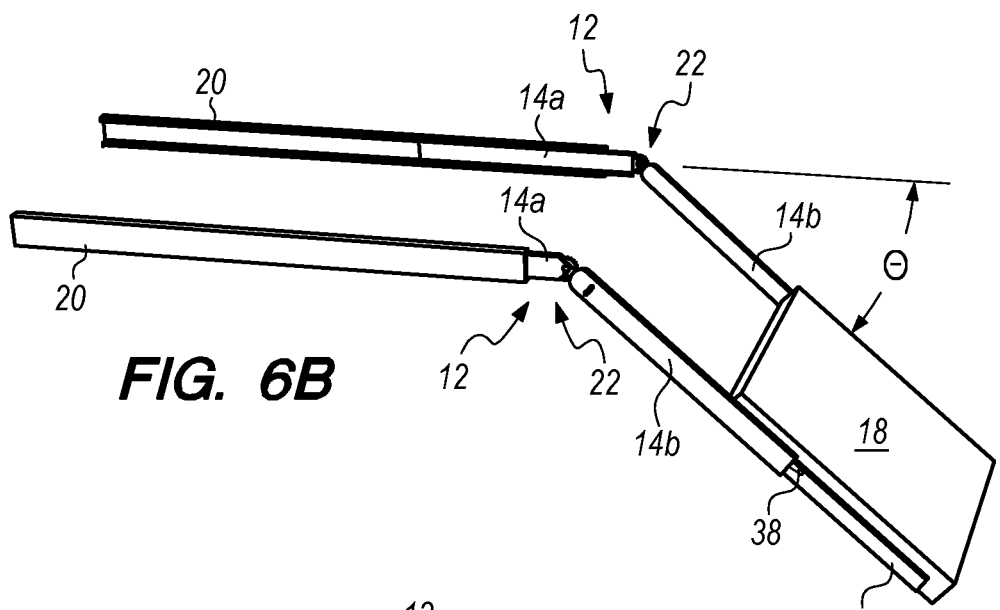
Figure 6C:
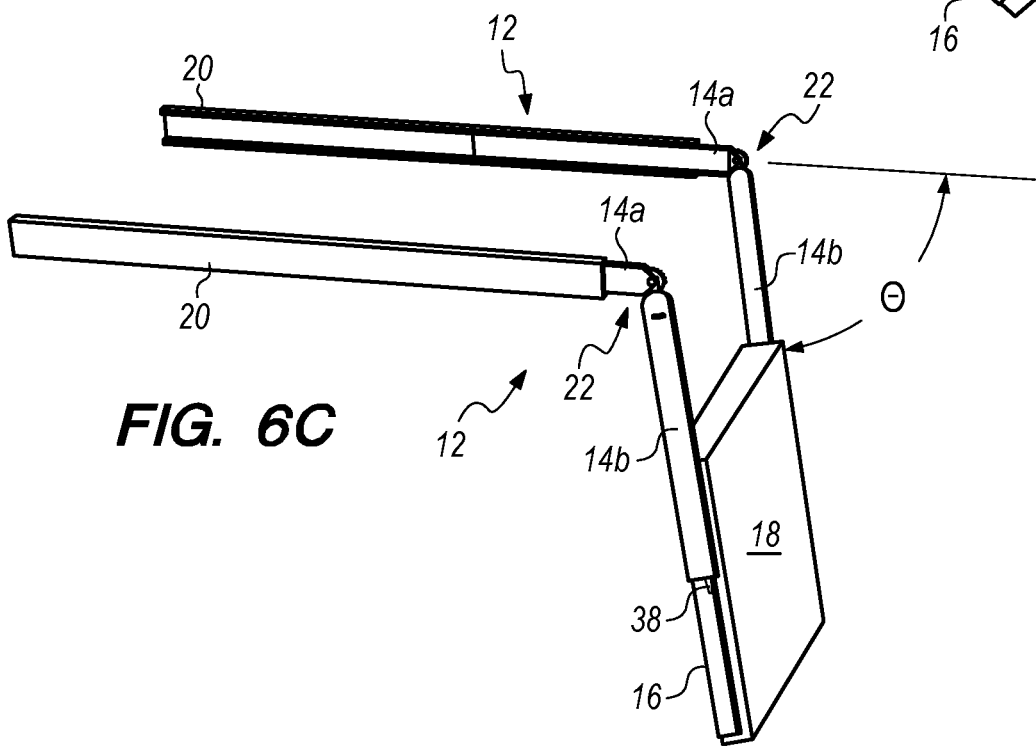

FIGS. 6A, 6B and 6C are perspective views of a pair of rail assemblies 12 securing a support member 18, such as a server, in an extended position, with the first rail 14 in straight, angled and downward positions, respectively. The second rail 16 and the support member 18 may assume one of a number of angled positions which are downwardly extending relative to the position shown in FIG. 6A. When a person manually moves the free end 38 of the lever arm from the locked position (upward position of the free end 38; shown in FIG. 5A) to the unlocked position (downward position of the free end 38; shown in FIG. 5B), the person may then lower the support member 18 to a desired angle "θ". Each possible position or angle differs from the immediately preceding position or angle as a function of the pitch of the teeth 24 in the gear 23. In other words, each tooth 24 (or gap between adjacent teeth 24) defines a position or angle at which the support member 18 may be secured. In at least one of these downwardly extending positions, the second rail 16 (and thus the support member 18 carried by them) are inclined relative to the horizontal (i.e., relative the direction of retraction and extension shown in FIG. 2) by an angle, e.g. 30°, 45°, 60° and 90°.

FIG. 6B illustrates how the pivoting joint 22 may be locked in an inclined position, such as about a 45° angle. To then pivot the support member 18 further downward, the lock must be unlocked. To allow the second rails 16 (as well as the support member 18) to return to the (horizontal) position as shown in FIG. 6A, the free end 38 of the lever arm should be in the locked position (upward position of the free end 38; shown in FIG. 5A). If the lock has a spring 32, the free end 38 should already be in the locked position, such that the support member 18 and second rails 16 may be simply manually pivoted upwardly until reaching the desired position where the rail assembly will be locked against pivoting downward.

In reference to FIG. 6C, the second rails 16 and the support member 18 carried by them may also be moved to a vertically downwardly extending position (i.e., substantially parallel to the vertical), such that equipment, e.g. a server or other support member 18 also extends vertically downwardly. This allows for easy access to and maintenance of the server even at a rack height greater than 28U. Pivoting the support member 18 downward requires that the pivoting joint 22 be unlocked, whereas the support member 18 may be pivoted upward with the pivoting joint 22 locked.

Figure 7A:
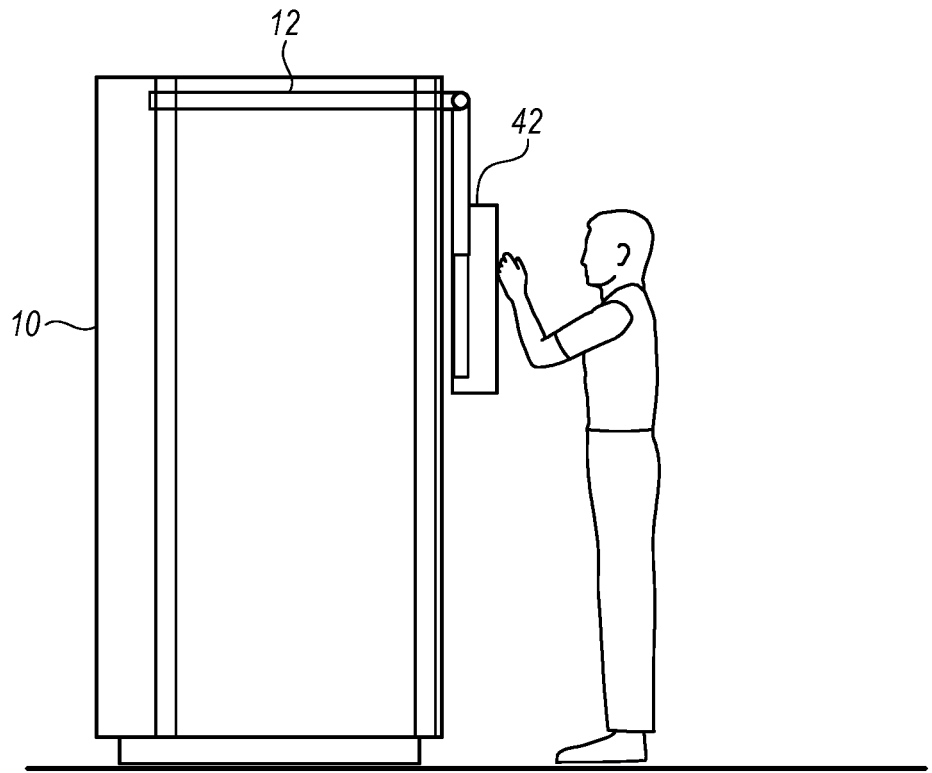
FIG. 7A is a diagram illustrating the servicing of a server at a rack height above 28U by articulating the rail assembly downwardly.

FIG. 7A is a diagram illustrating the servicing of a server 42 that occupies a portion of a rack 10 at a rack height above 28U using a rail assembly 12 according to various disclosed embodiments. The substantially vertical position of the server 42 corresponds with the configuration of the rail assembly 12 shown in FIG. 6C.

Figure 7B:
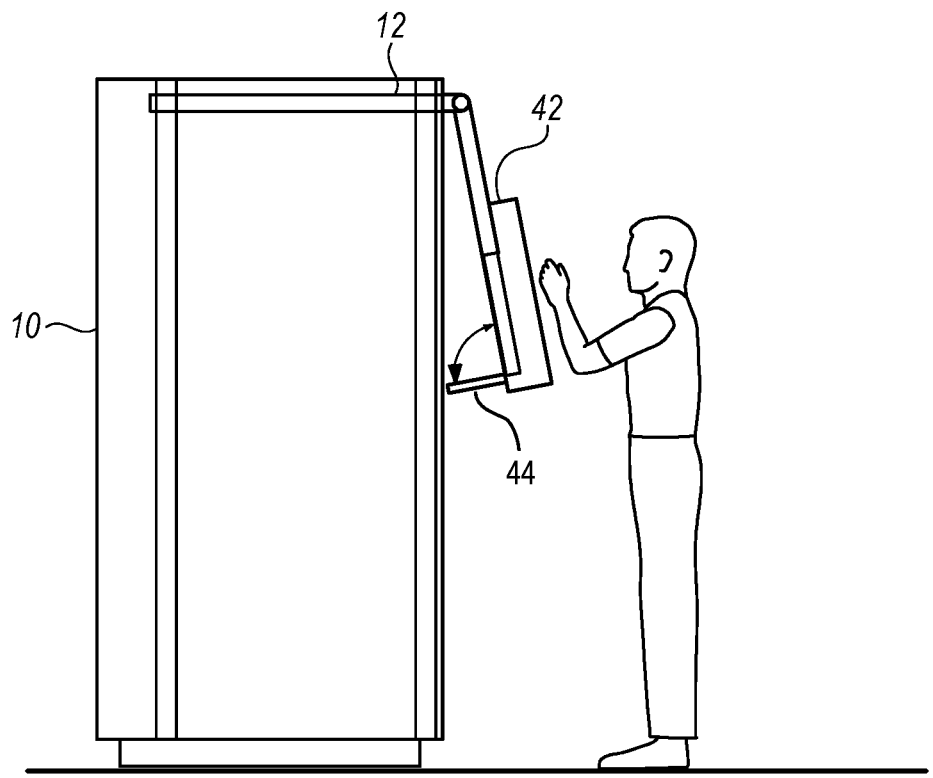
FIG. 7B is a diagram illustrating the servicing of a server at a rack height above 28U by articulating the rail assembly downwardly and resting the server against the rack with a folding bracket.

FIG. 7B is a diagram illustrating the servicing of the server 42 as described in reference to FIG. 7A, except that a folding bracket or leg 44 is incorporated to rest the server against the rack at an angle. In various embodiments, perhaps to enhance safety and/or ease of servicing, either the second rails 16 or the server 42 may include at least one leg 44 which may be positioned between the server rack 10 and either the second pair of rails 16 or the server 42, to enable the support 18 (and thus the pair of rails 16) to remain at a position which is inclined relative to the vertical rack. The leg 44 may be pivotally engaged with the support 18, or may be pivotally engaged with one or more of the second rails 16.

Figure 8A:
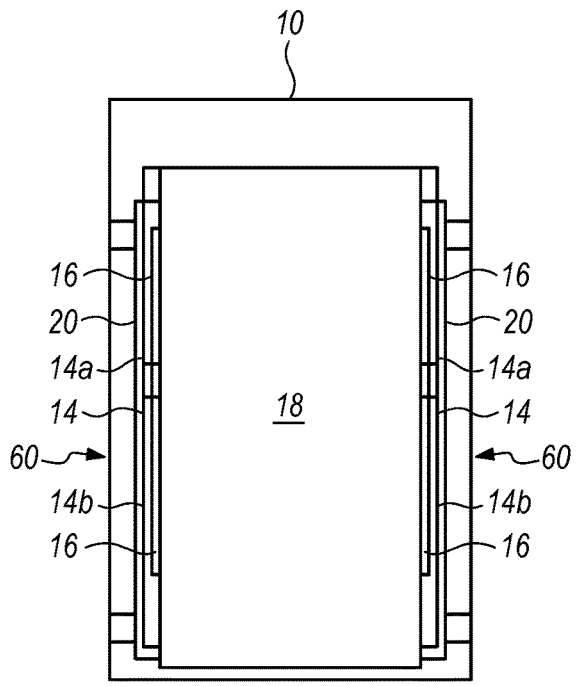
FIGS. 8A and 8B are top views of the rail assembly in a fully retracted position and a fully extended position, respectively, as in FIGS. 3A and 3B except that the rail member coupled to the server is longer.
Figure 8B:
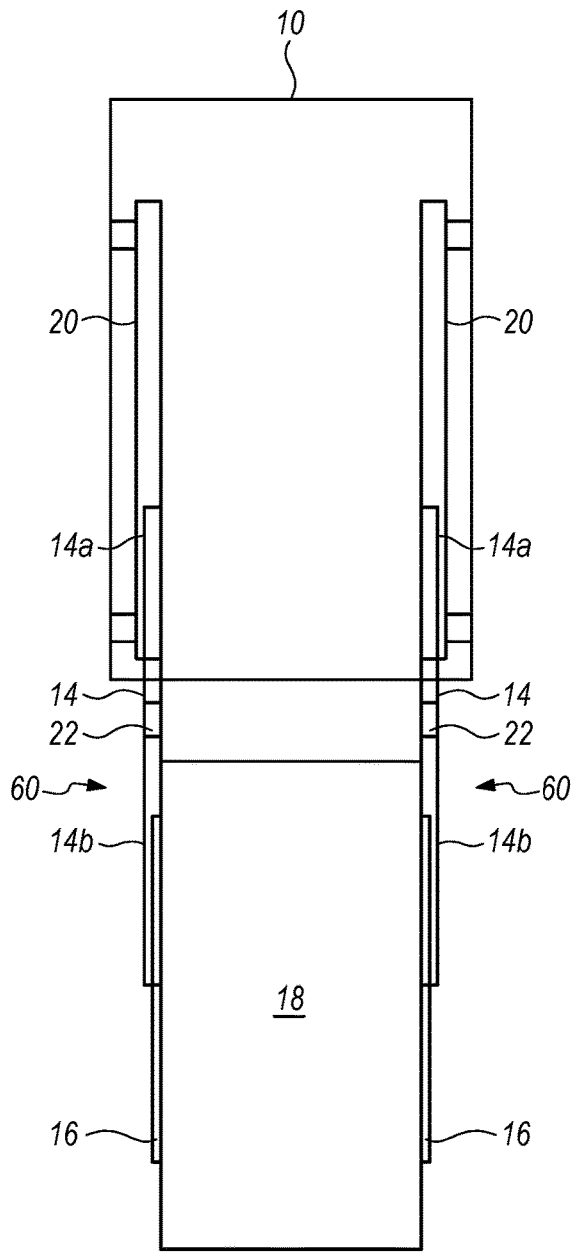

FIGS. 8A and 8B are top views of a rack 10 having a pair of rail assemblies 60 in a fully retracted position and a fully extended position, respectively. Each rail assembly 60 is similar to the rail assemblies 12 shown in FIGS. 3A and 3B (in fact FIGS. 2 through 7B) except for modifications that allow the second rail 16 to be longer than the second rail section 14b. In FIG. 8A, the rail assemblies 60 are in a fully retracted condition where the second rail 16 has slid along the first rail 14 to an extent that the second rail 16 rests along or within both the first rail section 14a and the second rail section 14b. A benefit of this embodiment is that the support member 18 may also be longer than the embodiment of FIGS. 3A and 3B. FIG. 8B shows the rail assemblies 60 in a fully extended condition where the second rail 16 has slid along the first rail 14 to an extent that the second rail 16 and the support member 18 are clear of the rack. More specifically, the second rail 16 no longer engages the first rail section 14a and now only engages the second rail section 14b. Accordingly, the pivot joint 22 is unhindered and may now be unlocked to permit downward pivoting of the support member 18. The structure and operation of the pivoting joint 22 and the lock 50 (see FIGS. 4A to 7B) may be the same as previous described. In FIGS. 8A to 9B, the element numbers of components described in reference to a previous embodiment may be used again to refer to a similar component in the present embodiment.

Figure 9A:
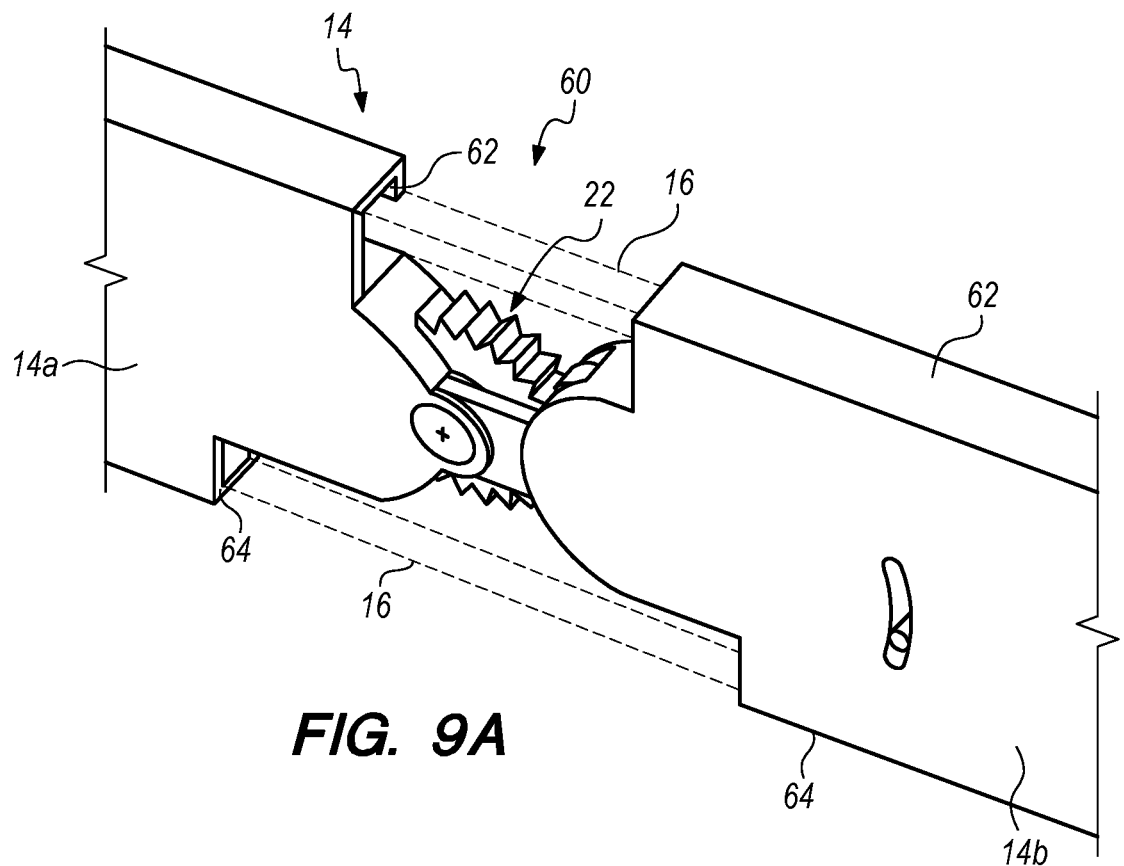
FIG. 9A is a partial perspective view of an articulating rail member that enables an elongated rail member to slide past the locking mechanism.

FIG. 9A is a partial perspective view of a first rail 14 that enables an elongated second rail 16 to slide past the pivot joint 22. The length of the second rail 16 may be made longer than the length of the second rail section 14b by providing both the first and second rail sections 14a, 14b with a top bracket 62 that extends along the top of the first rail 14 above the pivot joint 22 to receive the second rail 16 and a bottom bracket 64 that extends along the bottom of the first rail 14 below the pivot joint 22 to receive the second rail 16. Although the second rail 16 maintains engagement with the second rail section 14b in both the retracted and extended conditions, the second rail 16 will only engage the first rail section 14a when the pivot joint 22 is in a straight configuration and the second rail 16 is retracted. The longer second rail 16 enables a longer support member 18 to be received within the rack since the second rail 16 is able to retract over both the first and second rail sections 14a, 14b of the first rail 14.

Figure 9B:
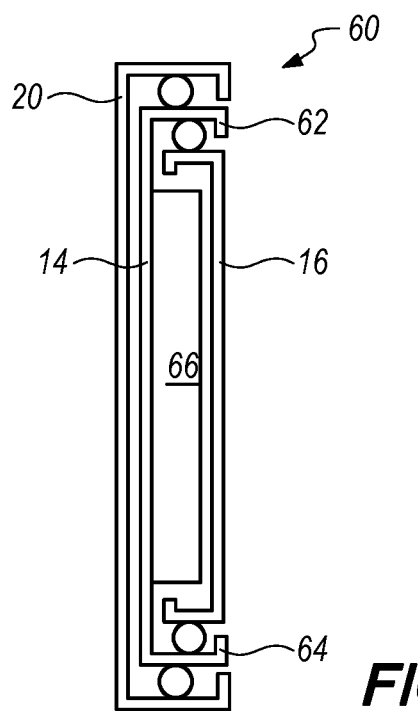
FIG. 9B is an end view of a rail assembly including the articulating rail member of FIG. 9A.

FIG. 9B is an end view of the rail assembly 60 of FIGS. 8A and 8B, including the first rail 14 of FIG. 9A. As shown, the first rail 14 is slidably received in the track 20, which is secured to the rack. The circles represent optional ball bearings that enable smooth and low-friction sliding between the track and rails, and may also serve to hold the track and rails together. Accordingly, the upper and lower segments of the track 20, first rail 14, and second rail 16 form a bearing surface. In fact, since the first rail 14 is an intermediate rail slidably engaging both the track 20 and the second rail 16, the upper segment (bracket) 62 may have two bearing surfaces and the lower segment (bracket) 64 may also have two bearing surfaces.

The second rail 16 is slidably received in the top bracket 62 and bottom bracket 64 of the first rail 14. However, the second rail 16 does not use the space 66 where the pivot joint 22 and lock 50 (see FIGS. 4A-5B) of the first rail 14 are located, such that the second rail 16 can simply slide past the pivot joint 22 and lock 50. It should be noted that in embodiments (see FIGS. 3A-5B) where the pivot joint 22 blocks the path of the second rail 16 (i.e., space 66 doesn't leave room for the second rail to pass), then the second rail 16 can only retract into the second rail section 14b.

It should be understood that the above description only illustrates example embodiments, and that various modifications and/or alterations may be made thereto within the scope of the claims. It should also be understood that various features of the embodiments which are, for brevity, described here in the context of a single embodiment, may also be provided separately or in any appropriate sub-combinations.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:

1. An apparatus comprising:
a track for securing in a rack;
a first rail slidably coupled to the track, wherein the first rail is movable relative to the track between a retracted position and an extended position, and wherein the first rail includes a first rail section, a second rail section, and a pivoting joint coupling the first rail section to the second rail section; and
a second rail slidably coupled to the first rail, wherein the second rail is movable relative to the first rail between a retracted position and an extended position;
wherein, with the first rail in the extended position and the second rail in the extended position, the pivoting joint allows the second rail and the second rail section of the first rail to pivot relative to the track and the first rail section of the first rail.

2. The apparatus of claim 1, wherein the pivoting joint allows the second rail and the second rail section of the first rail to pivot downwardly to an acute angle greater than 45 degrees.

3. The apparatus of claim 1, wherein the pivoting joint allows the second rail and the second rail section of the first rail to pivot downwardly to a substantially vertical orientation.

4. The apparatus of claim 1, further comprising:
a leg pivotally coupled to the second rail, wherein the leg pivots between a retracted position along the second rail and a deployed position to engage the rack and support the second rail at an acute angle relative to the rack.

5. The apparatus of claim 1, further comprising:
a lock manually movable between a locked position and an unlocked position, wherein the locked position prevents downward pivotal movement of the second rail and the second rail section of the first rail about the pivoting joint relative to the track, and wherein the unlocked position allows downward pivotal movement of the second rail and the second rail section of the first rail about the pivoting joint relative to the track.

6. The apparatus of claim 5, wherein the lock includes a ratchet mechanism, and wherein, in the unlocked position, the ratchet mechanism allows downward pivotal movement of the second rail and the second rail section of the first rail about the pivoting joint, and wherein, in the locked position, the ratchet mechanism limits further downward pivotal movement of the second rail and the second rail section of the first rail about the pivoting joint.

7. The apparatus of claim 6, wherein the ratchet mechanism includes a gear fixed to the first rail section of the first rail and a pawl coupled to the second rail section of the first rail.

8. The apparatus of claim 7, wherein the lock includes a lever arm pivotally coupled to the second rail section of the first rail and extending beyond a distal end of the second rail section of the first rail, wherein manually actuating the lever arm moves the lock from the locked position to the unlocked position.

9. The apparatus of claim 8, further comprising:
a spring biasing the lever arm to a position that puts the lock in the locked position, wherein manually actuating the lever arm to move the lock to the unlocked position requires overcoming a spring force of the spring.

10. The apparatus of claim 8, wherein the pawl is pivotally coupled to the second rail section and pivotally coupled to a distal end of the lever arm, wherein, with the lock in the locked position, the pawl engages the gear to prevent downward pivotal movement of the second rail and the second rail section of the first rail about the pivoting joint, and, in response to manually actuating the lever arm to move the lock to the unlocked position, the pawl disengages the gear to allow downward pivotal movement of the second rail and the second rail section of the first rail about the pivoting joint.

11. The apparatus of claim 8, wherein the lock includes a catch member having a first finger that forms the pawl and a second finger that forms a second pawl, wherein the catch member is coupled to the a distal end of the lever arm, wherein, with the lock in the locked position, the first finger engages the gear to prevent downward pivotal movement of the second rail and the second rail section of the first rail about the pivoting joint, and, in response to manually actuating the lever arm to move the lock to the unlocked position, the second finger engages the gear and allows downward pivotal movement of the second rail and the second rail section of the first rail about the pivoting joint.

12. An apparatus, comprising:
a rack having a frame for supporting a server; and
a pair of rail assemblies for coupling opposing sides of the server to the frame, each rail assembly including:
a track secured to the frame;
a first rail slidably coupled to the track, wherein the first rail is movable relative to the track between a retracted position and an extended position, and wherein the first rail includes a first rail section, a second rail section, and a pivoting joint coupling the first rail section to the second rail section; and
a second rail for securing to one of the opposing sides of the server, wherein the second rail is slidably coupled to the first rail and movable relative to the first rail between a retracted position and an extended position, and wherein, with the first rail in the extended position and the second rail in the extended position, the pivoting joint allows the second rail and the second rail section of the first rail to pivot relative to the track and the first rail section of the first rail.

13. The apparatus of claim 12, wherein one or more rail assembly of the pair further includes:
a lock manually movable between a locked position and an unlocked position, wherein the locked position prevents downward pivotal movement of the second rail and the second rail section of the first rail about the pivoting joint relative to the track, and wherein the unlocked position allows downward pivotal movement of the second rail and the second rail section of the first rail about the pivoting joint relative to the track.

14. The apparatus of claim 13, wherein the lock includes a ratchet mechanism, and wherein, in the unlocked position, the ratchet mechanism allows downward pivotal movement of the second rail and the second rail section of the first rail about the pivoting joint, and wherein, in the locked position, the ratchet mechanism limits further downward pivotal movement of the second rail and the second rail section of the first rail about the pivoting joint.

15. The apparatus of claim 14, wherein the ratchet mechanism includes a gear fixed to the first rail section of the first rail and a pawl coupled to the second rail section of the first rail.

16. The apparatus of claim 15, wherein the lock includes a lever arm pivotally coupled to the second rail section of the first rail and extending beyond a distal end of the second rail section of the first rail, wherein manually actuating the lever arm moves the lock from the locked position to the unlocked position.

17. The apparatus of claim 16, further comprising:
a spring biasing the lever arm to a position that puts the lock in the locked position, wherein manually actuating the lever arm to move the lock to the unlocked position requires overcoming a spring force of the spring.

18. The apparatus of claim 16, wherein the pawl is pivotally coupled to the second rail section and pivotally coupled to a distal end of the lever arm, wherein, with the lock in the locked position, the pawl engages the gear to prevent downward pivotal movement of the second rail and the second rail section of the first rail about the pivoting joint, and, in response to manually actuating the lever arm to move the lock to the unlocked position, the pawl disengages the gear to allow downward pivotal movement of the second rail and the second rail section of the first rail about the pivoting joint.

19. The apparatus of claim 12, wherein the second rail is longer than the second section of the first rail such that, with the second rail in the retracted position, the second rail is disposed along the first and second rail sections of the first rail.

20. The apparatus of claim 1, wherein the second rail is longer than the second section of the first rail such that, with the second rail in the retracted position, the second rail is disposed along the first and second rail sections of the first rail.

* * * * *